(12) United States Patent
Lee et al.

(10) Patent No.: US 10,621,039 B2
(45) Date of Patent: Apr. 14, 2020

(54) ELECTRONIC DEVICES

(71) Applicant: SK hynix Inc., Icheon-si, Gyeonggi-do (KR)

(72) Inventors: Jae In Lee, Icheon-si (KR); Youngjae Jin, Seoul (KR)

(73) Assignee: SK hynix Inc., Icheon-si, Gyeonggi-do (KR)

( * ) Notice: Subject to any disclaimer, the term of this patent is extended or adjusted under 35 U.S.C. 154(b) by 37 days.

(21) Appl. No.: 16/121,122

(22) Filed: Sep. 4, 2018

(65) Prior Publication Data

US 2019/0179702 A1 Jun. 13, 2019

(30) Foreign Application Priority Data

Dec. 7, 2017 (KR) .................. 10-2017-0167842

(51) Int. Cl.
| | | |
|---|---|---|
| *G06F 11/10* | (2006.01) | |
| *G11C 7/22* | (2006.01) | |
| *G11C 29/52* | (2006.01) | |
| *G11C 29/02* | (2006.01) | |
| *G11C 8/18* | (2006.01) | |
| *G11C 11/408* | (2006.01) | |
| *G11C 8/12* | (2006.01) | |
| *G11C 11/4076* | (2006.01) | |

(Continued)

(52) U.S. Cl.
CPC ............ *G06F 11/1068* (2013.01); *G11C 7/22* (2013.01); *G11C 8/12* (2013.01); *G11C 8/18* (2013.01); *G11C 11/408* (2013.01); *G11C 11/4076* (2013.01); *G11C 29/023* (2013.01); *G11C 29/028* (2013.01); *G11C 29/52* (2013.01); *G11C 2029/0411* (2013.01); *G11C 2211/4062* (2013.01); *H03K 19/20* (2013.01)

(58) Field of Classification Search
CPC ......... G06F 11/1068; G11C 7/22; G11C 8/12; G11C 8/18; G11C 11/4076; G11C 11/408; G11C 29/023; G11C 29/028; G11C 29/52; G11C 2029/0411; G11C 2211/4062; H03K 19/20
See application file for complete search history.

(56) References Cited

U.S. PATENT DOCUMENTS

| 9,368,173 B1 * | 6/2016 | Yun .................... G11C 7/222 |
| 2003/0142118 A1 * | 7/2003 | Funamoto ............ G09G 3/3406 |
| | | 345/691 |

(Continued)

FOREIGN PATENT DOCUMENTS

| KR | 1020160016051 A | 2/2016 |
| KR | 1020180106495 A | 10/2018 |

*Primary Examiner* — Kyle Vallecillo
(74) *Attorney, Agent, or Firm* — William Park & Associates Ltd.

(57) ABSTRACT

An electronic device includes an area control signal generation circuit and an area column control signal generation circuit. The area control signal generation circuit generates an area control signal in response to an operation control signal and an internal information signal. The area control signal includes information on whether each of a plurality of cell areas performs an error correction operation. The area column control signal generation circuit delays a column pulse signal for a delay period, which is determined according to the area control signal, to generate an area column control signal that controls a column operation of the plurality of cell areas.

24 Claims, 13 Drawing Sheets

(51) Int. Cl.
    *H03K 19/20*      (2006.01)
    *G11C 29/04*      (2006.01)

(56)              References Cited

U.S. PATENT DOCUMENTS

2004/0193966 A1*  9/2004  Hirabayashi ........ G06F 11/1008
                                                      714/54
2015/0074493 A1*  3/2015  Kajigaya ............. G06F 11/1048
                                                      714/764
2015/0149858 A1*  5/2015  Cha ......................... G06F 11/10
                                                      714/763
2019/0027230 A1*  1/2019  Ryu ....................... G11C 29/42

* cited by examiner

FIG.4

| IOP<4> | IOP<3> | IOP<2> | IOP<1> | TCON | |
|---|---|---|---|---|---|
| L | L | L | L | H | ALL AREA ECC OFF |
| L | L | L | H | H | AREA1 ECC ON<br>AREA2,3,4 ECC OFF |
| L | L | H | L | H | AREA2 ECC ON<br>AREA1,3,4 ECC OFF |
| L | L | H | H | H | AREA1,2 ECC ON<br>AREA3,4 ECC OFF |
| L | H | L | L | H | AREA3 ECC ON<br>AREA1,2,4 ECC OFF |
| L | H | H | H | H | AREA1,2,3 ECC ON<br>AREA4 ECC OFF |
| H | H | H | H | H | ALL AREA ECC ON |

ELECTRONIC DEVICES

CROSS-REFERENCE TO RELATED APPLICATIONS

The present application claims priority under 35 U.S.C 119(a) to Korean Application No. 10-2017-0167842, filed on Dec. 7, 2017, which is incorporated herein by reference in its entirety.

BACKGROUND

1. Technical Field

Embodiments of the present disclosure relate to electronic devices performing an error correction operation.

2. Related Art

Recently, a DDR2 scheme or a DDR3 scheme receiving and outputting four-bit data or eight-bit data during each clock cycle has been used to improve an operation speed of semiconductor devices. If a data transmission speed of the semiconductor devices becomes faster, the probability of errors occurring may increase while data is transmitted in the semiconductor devices. Accordingly, various design schemes have been proposed to guarantee the reliability of data transmission.

Whenever data is transmitted in semiconductor devices, error codes which are capable of detecting the occurrence of errors may be generated and transmitted with the data to guarantee the reliability of data transmission. The error codes may include an error detection code (EDC) which is capable of detecting errors and an error correction code (ECC) which is capable of correcting the detected errors by itself.

An ECC function is disclosed in U.S. Pat. No. 9,646,718 to Park et al., entitled "SEMICONDUCTOR MEMORY DEVICE HAVING SELECTIVE ECC FUNCTION".

SUMMARY

According to an embodiment, an electronic device includes an area control signal generation circuit and an area column control signal generation circuit. The area control signal generation circuit generates an area control signal in response to an operation control signal and an internal information signal. The area control signal is generated to include information on whether each of a plurality of cell areas performs an error correction operation. The area column control signal generation circuit delays a column pulse signal for a delay period, which is determined according to the area control signal, to generate an area column control signal that controls a column operation of the plurality of cell areas.

According to another embodiment, an electronic device includes an area control signal generation circuit and an operation control circuit. The area control signal generation circuit generates an area control signal in response to an operation control signal and an internal information signal. The area control signal is generated to include information on whether each of a plurality of cell areas performs an error correction operation. The operation control circuit controls a refresh cycle time of each of the plurality of cell areas or controls a voltage level of an internal voltage signal of each of the plurality of cell areas, according to the area control signal.

According to yet another embodiment, an electronic device includes an area control signal generation circuit, an area column control signal generation circuit, an area command/address generation circuit, a core circuit, and an operation control circuit. The area control signal generation circuit generates an area control signal in response to an operation control signal and an internal information signal. The area control signal is generated to include information on whether each of a plurality of cell areas performs an error correction operation. The area column control signal generation circuit delays a column pulse signal for a delay period, which is determined according to the area control signal, to generate an area column control signal that controls a column operation of the plurality of cell areas. The area command/address generation circuit generates a first delayed command, a second delayed command, a first delayed address, and a second delayed address by delaying an internal command and an address for a predetermined delay period which is determined according to the area control signal. The core circuit controls the column operation of the plurality of cell areas in response to the first and second delayed commands, the first and second delayed addresses, and the area column control signal. The operation control circuit controls a refresh cycle time of each of the plurality of cell areas or controls a voltage level of an internal voltage signal of each of the plurality of cell areas, according to the area control signal.

BRIEF DESCRIPTION OF THE DRAWINGS

Various embodiments of the present disclosure will become more apparent in view of the attached drawings and accompanying detailed description, in which:

FIG. 4 is a table illustrating an operation of the area control signal generation circuit shown in FIG. 3;

DETAILED DESCRIPTION OF THE EMBODIMENTS

Various embodiments of the present disclosure will be described hereinafter with reference to the accompanying drawings. However, the embodiments described herein are for illustrative purposes only and are not intended to limit the scope of the present disclosure.

Figure 1:
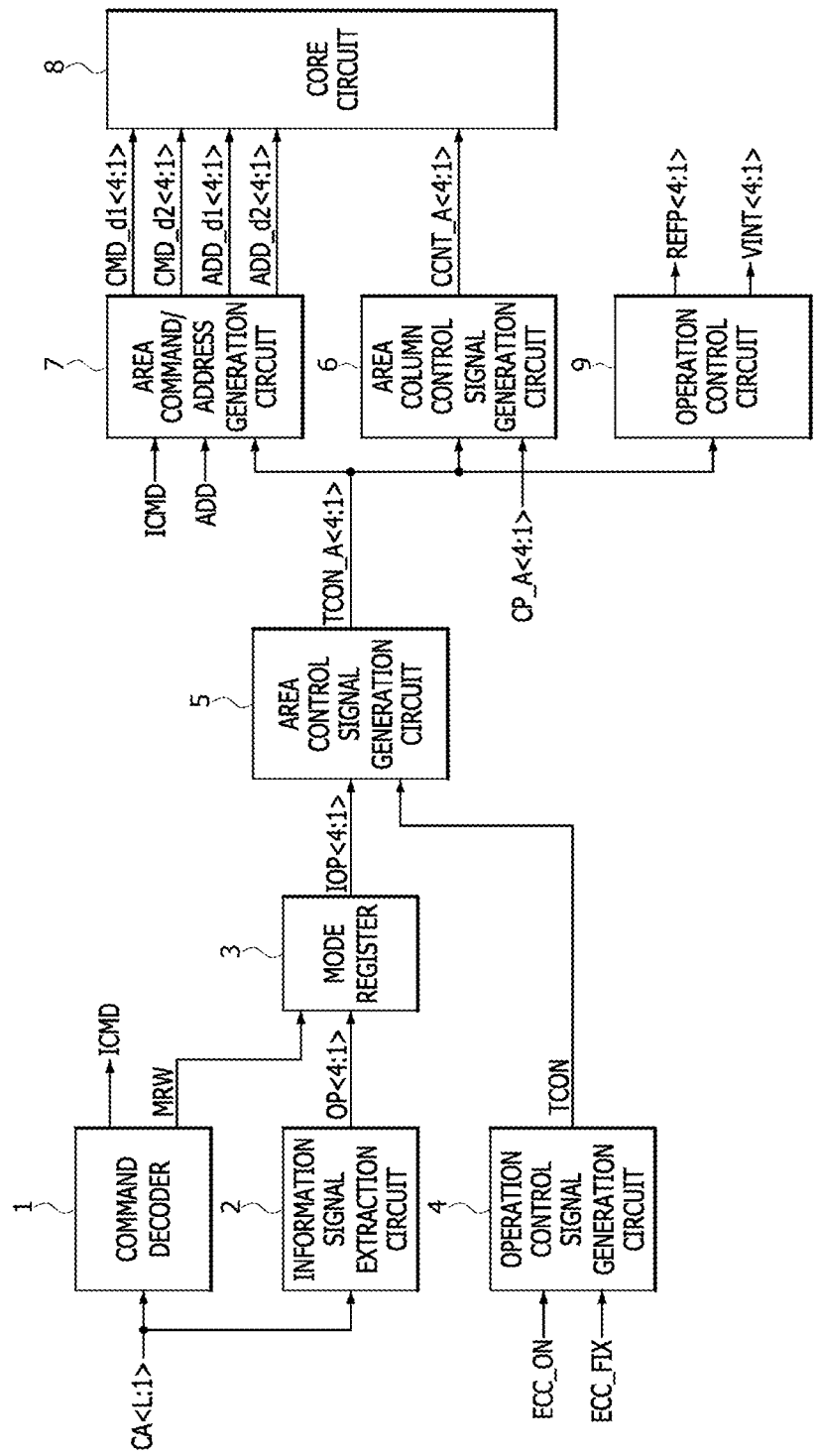
FIG. 1 is a block diagram illustrating a configuration of an electronic device according to an embodiment of the present disclosure.

As illustrated in FIG. 1, an electronic device according to an embodiment may include a command decoder 1, an information signal extraction circuit 2, a mode register 3, an operation control signal generation circuit 4, an area control signal generation circuit 5, an area column control signal generation circuit 6, an area command/address generation circuit 7, a core circuit 8, and an operation control circuit 9.

The command decoder 1 may generate an internal command ICMD and a mode register write signal MRW in response to an external control signal CA<L:1>. The command decoder 1 may decode the external control signal CA<L:1> to generate the internal command ICMD and the mode register write signal MRW. One of the internal command ICMD and the mode register write signal MRW may be selectively enabled according to a logic level combination of the external control signal CA<L:1>. The external control signal CA<L:1> may include an address, a command, and an information signal OP<4:1>. The number of bits included in the external control signal CA<L:1> may be set to be different according to the embodiment. The internal command ICMD may be enabled to perform a read operation or a write operation. Although the internal command ICMD is illustrated using a single signal line, the internal command ICMD may use a plurality of signal lines, each of which corresponds with any one of various operations, according to the embodiment. The mode register write signal MRW may be enabled to perform a mode register write operation.

The information signal extraction circuit 2 may generate an information signal OP<4:1> in response to the external control signal CA<L:1>. The information signal extraction circuit 2 may extract data some bits included in the external control signal CA<L:1> to output the extracted data as the information signal OP<4:1>. In the present embodiment, the number of the bits included in the information signal OP<4:1> is set to be four that corresponds with the number of first to fourth areas or first to fourth cell areas (821, 822, 823, and 824 of FIG. 10) included in the core circuit 8, but the number of the bits included in the information signal may be set to be different according to the embodiment.

The mode register 3 may store the information signal OP<4:1> therein and may generate an internal information signal IOP<4:1>, in response to the mode register write signal MRW. The mode register 3 may store the information signal OP<4:1> therein and may output the stored information signal OP<4:1> as the internal information signal IOP<4:1>, if the mode register write signal MRW is enabled to perform the mode register write operation. The internal information signal IOP<4:1> may be extracted and generated from the information signal OP<4:1> if a mode register write operation is performed. In the present embodiment, the information signal OP<4:1> may include information about the areas 821, 822, 823, or 824 performing an error correction operation. A logic level combination of the information signal OP<4:1> representing the area performing the error correction operation may be set to be different according to the embodiment. The information signal OP<4:1> may also include information on a latency, a burst length, and the like.

The operation control signal generation circuit 4 may generate an operation control signal TCON in response to an error correction operation activation signal ECC_ON and a fix signal ECC_FIX. The error correction operation activation signal ECC_ON and the fix signal ECC_FIX may be enabled if the error correction operation is performed. The error correction operation activation signal ECC_ON may be provided by an external device such as a controller (not shown) or a test apparatus (not shown). The fix signal ECC_FIX may be generated by an internal circuit of the electronic device, and enablement of the fix signal ECC_FIX may be controlled according to an electrical open/short state of a fuse included in the electronic device. A logic level of the error correction operation activation signal ECC_ON and the fix signal ECC_FIX, which are enabled, may be set to be different according to the embodiment. The operation control signal generation circuit 4 may generate the operation control signal TCON which is enabled if the error correction operation activation signal ECC_ON or the fix signal ECC_FIX is enabled. A logic level of the operation control signal TCON, which is enabled, may be set to be different according to the embodiment. A configuration and an operation of the operation control signal generation circuit 4 will be described more fully with reference to FIG. 2 later.

The area control signal generation circuit 5 may generate an area control signal TCON_A<4:1> in response to the internal information signal IOP<4:1> and the operation control signal TCON. The area control signal generation circuit 5 may generate the area control signal TCON_A<4:1> including four bits which are selectively enabled to perform the error correction operation in the areas 821, 822, 823, and 824 which are selected according to a logic level combination of the internal information signal IOP<4:1> while the operation control signal TCON is enabled to perform the error correction operation. Enabled bits among the bits included in the area control signal TCON_A<4:1> may be determined according to a logic level combination of the internal information signal IOP<4:1>. A configuration and operation of the area control signal generation circuit 5 will be described more fully with reference to FIGS. 3 and 4 later.

The area column control signal generation circuit 6 may generate an area column control signal CCNT_A<4:1> from a column pulse signal CP_A<4:1> in response to the area control signal TCON_A<4:1>. The area column control signal generation circuit 6 may delay the column pulse signal CP_A<4:1> for a delay period, which is set according to a logic level combination of the area control signal TCON_A<4:1>, to generate the area column control signal CCNT_A<4:1>. The column pulse signal CP_A<4:1> may be created to perform column operations of the areas 821, 822, 823, and 824 separately. Each column operation may include the read operation and the write operation. The column pulse signal CP_A<4:1> may be created to independently activate a read driver (not shown) or a write driver (not shown) of each area. In the present embodiment, the number of the bits included in the column pulse signal CP_A<4:1> is set to be four that corresponds with the number of first to fourth areas (821, 822, 823 and 824 of FIG. 10) included in the core circuit 8, but the number of the bits included in the column pulse may be set to be different according to the embodiment. A configuration and an operation of the area column control signal generation circuit 6 will be described more fully with reference to FIGS. 5 and 6 later.

The area command/address generation circuit 7 may generate a first delayed command CMD_d1<4:1>, a second delayed command CMD_d2<4:1>, a first delayed address ADD_d1<4:1>, and a second delayed address ADD_d2<4:1> from the internal command ICMD and an address ADD, in response to the area control signal TCON_A<4:1>. The area command/address generation circuit 7 may generate the first delayed command CMD_d1<4:1> and the second delayed command CMD_d2<4:1> by delaying the internal command ICMD for a delay period which is set according to a logic level combination of the area control signal TCON_A<4:1>. The area command/address generation circuit 7 may generate the first delayed address ADD_d1<4:1> and the second delayed address ADD_d2<4:1> by delaying the internal command ICMD for a delay period which is set according to a logic level combination of the area control signal TCON_A<4:1>. A configuration and an operation of the area command/address generation circuit 7 will be described more fully with reference to FIGS. 7, 8, and 9 later.

The core circuit 8 may control the column operations of the first to fourth areas 821, 822, 823, and 824 in response to the first and second delayed commands CMD_d1<4:1> and CMD_d2<4:1>, the first and second delayed addresses ADD_d1<4:1> and ADD_d2<4:1>, and the area column control signal CCNT_A<4:1>. A configuration and an operation of the core circuit 8 will be described more fully with reference to FIG. 10 later.

The operation control circuit 9 may generate a refresh pulse signal REFP<4:1> and an internal voltage signal VINT<4:1> in response to the area control signal TCON_A<4:1>. The operation control circuit 9 may control a cycle time of data bits included in the refresh pulse signal REFP<4:1> or may control levels of data bits included in the internal voltage signal VINT<4:1>, according to a logic level combination of the area control signal TCON_A<4:1>. In other words, the operation control circuit 9 may control the refresh cycle time of each of the plurality of cell areas 821, 822, 823, and 824 or the operation control circuit 9 may control the voltage level of the internal voltage signal VINT<4:1> of each of the plurality of cell areas 821, 822, 823, and 824 according to a logic level combination of the area control signal TCON_A<4:1>. In one example, the operation control circuit 9 may increase the refresh cycle time of the cell area 821, 822, 823, or 824 performing the error correction operation. A configuration and an operation of the operation control circuit 9 will be described more fully with reference to FIG. 11 later.

Figure 2:
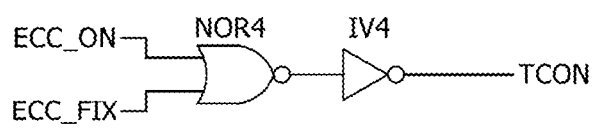
FIG. 2 is a circuit diagram illustrating an example of an operation control signal generation circuit included in the electronic device of FIG. 1.

Referring to FIG. 2, the operation control signal generation circuit 4 may include a NOR gate NOR4 and an inverter IV4. The operation control signal generation circuit 4 may perform a logical OR operation of the error correction operation activation signal ECC_ON and the fix signal ECC_FIX to generate the operation control signal TCON. The operation control signal generation circuit 4 may generate the operation control signal TCON which is enabled to have a logic "high" level if at least one of the error correction operation activation signal ECC_ON and the fix signal ECC_FIX is enabled to have a logic "high" level. If the operation control signal TCON is enabled, the error correction operation may be performed in at least one of the first to fourth areas 821, 822, 823, and 824 included in the core circuit 8.

Figure 3:
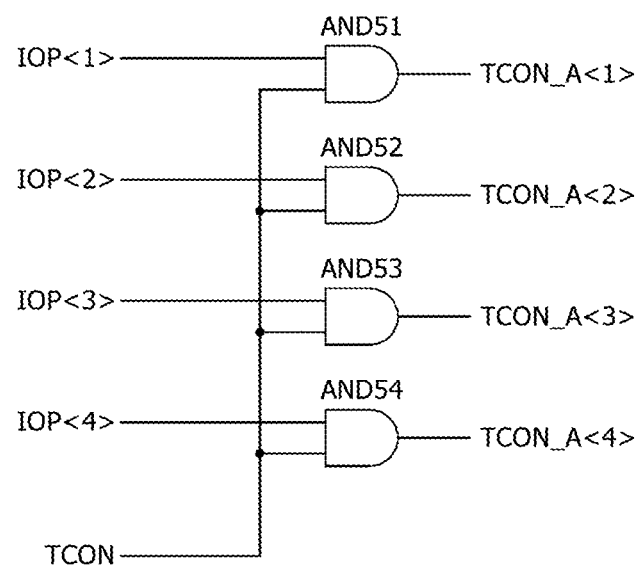
FIG. 3 is a circuit diagram illustrating an example of an area control signal generation circuit included in the electronic device of FIG. 1.

Referring to FIG. 3, the area control signal generation circuit 5 may include AND gates AND51, AND52, AND53, and AND54. The area control signal generation circuit 5 may perform a logical AND operation of the internal information signal IOP<4:1> and the operation control signal TCON to generate the area control signal TCON_A<4:1>. The area control signal generation circuit 5 may generate the area control signal TCON_A<4:1> including four bits, which are all disabled to have a logic "low" level, if the operation control signal TCON is disabled to have a logic "low" level. In such a case, none of the first to fourth areas 821, 822, 823, and 824 may perform the error correction operation. The area control signal generation circuit 5 may generate the area control signal TCON_A<4:1> having a first bit signal TCON_A<1> which is enabled to have a logic "high" level to perform the error correction operation of the first area 821 if a first bit IOP<1> of the internal information signal IOP<4:1> has a logic "high" level while the operation control signal TCON is enabled to have a logic "high" level. The area control signal generation circuit 5 may generate the area control signal TCON_A<4:1> having a second bit signal TCON_A<2> which is enabled to have a logic "high" level to perform the error correction operation of the second area 822 if a second bit IOP<2> of the internal information signal IOP<4:1> has a logic "high" level while the operation control signal TCON is enabled to have a logic "high" level. The area control signal generation circuit 5 may generate the area control signal TCON_A<4:1> having a third bit signal TCON_A<3> which is enabled to have a logic "high" level to perform the error correction operation of the third area 823 if a third bit IOP<3> of the internal information signal IOP<4:1> has a logic "high" level while the operation control signal TCON is enabled to have a logic "high" level. The area control signal generation circuit 5 may generate the area control signal TCON_A<4:1> having a fourth bit signal TCON_A<4> which is enabled to have a logic "high" level to perform the error correction operation of the fourth area 824 if a fourth bit IOP<4> of the internal information signal IOP<4:1> has a logic "high" level while the operation control signal TCON is enabled to have a logic "high" level.

FIG. 4 illustrates the areas included in the core circuit 8 in which the error correction operation is performed according to various logic level combinations of the internal information signal IOP<4:1> while the operation control signal TCON is enabled to have a logic "high" level. In the present embodiment, the error correction operation may be performed using an error correction code (ECC). Referring to FIG. 4, none of the first to fourth areas 821, 822, 823, and 824 performs the error correction operation if the internal information signal IOP<4:1> has a logic level combination of 'L,L,L,L', that is, all bits included in the internal information signal IOP<4:1> have a logic "low" level. Only the first area 821 among the first to fourth areas 821, 822, 823, and 824 performs the error correction operation if the internal information signal IOP<4:1> has a logic level combination of 'L,L,L,H', that is, only the first bit IOP<1> among the first to fourth bits included in the internal information signal IOP<4:1> has a logic "high" level. Only the second area 822 among the first to fourth areas 821, 822, 823 and 824 performs the error correction operation if the internal information signal IOP<4:1> has a logic level combination of 'L,L,H,L', that is, only the second bit IOP<2> among the first to fourth bits included in the internal information signal IOP<4:1> has a logic "high" level. Only the first and second areas 821 and 822 among the first to fourth areas 821, 822, 823, and 824 performs the error correction operation if the internal information signal IOP<4:1> has a logic level combination of 'L,L,H,H', that is, only the first and second bits IOP<2:1> among the first to fourth bits included in the internal information signal IOP<4:1> have a logic "high" level. Only the third area 823 among the first to fourth areas 821, 822, 823, and 824 performs the error correction operation if the internal information signal IOP<4:1> has a logic level combination of 'L,H,L,L', that is, only the third bit IOP<3> among the first to fourth bits included in the internal information signal IOP<4:1> has a logic "high" level. Only the first to third areas 821, 822, and 823 among the first to fourth areas 821, 822, 823, and 824 performs the error correction operation if the internal information signal IOP<4:1> has a logic level combination of 'L,H,H,H', that is, only the first to third bits IOP<3:1> among the first to fourth bits included in the internal information signal IOP<4:1> have a logic "high" level. All of the first to fourth areas 821, 822, 823, and 824 may perform the error correction operation if the internal information signal IOP<4:1> has a logic level combination of 'H,H,H,H', that is, all of the bits included in the internal information signal IOP<4:1> have a logic "high" level.

Figure 5:
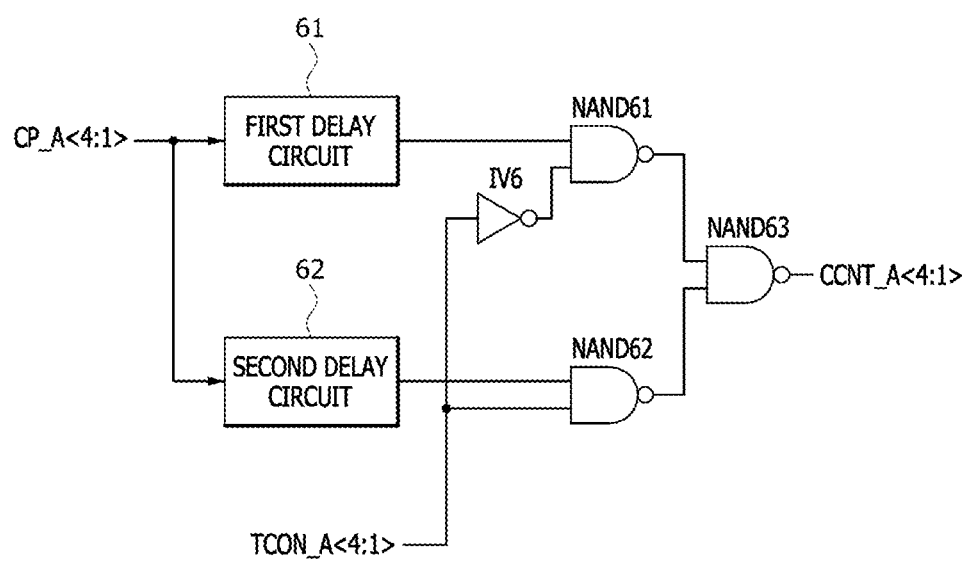
FIG. 5 illustrates an example of an area column control signal generation circuit included in the electronic device of FIG. 1.

Referring to FIG. 5, the area column control signal generation circuit 6 may include a first delay circuit 61, a second delay circuit 62, an inverter IV6, and NAND gates NAND61, NAND62, and NAND63. The first delay circuit 61 may delay the column pulse signal CP_A<4:1> for a first delay period to output the delayed column pulse. The second delay circuit 62 may delay the column pulse signals CP_A<4:1> for a second delay period to output the delayed column pulse. In the present embodiment, the second delay period may be set to be longer than the first delay period. However, in some other embodiments, the second delay period may be set to be shorter than the first delay period. An output signal of the first delay circuit 61 or the second delay circuit 62 may be buffered to provide the area column control signal CCNT_A<4:1> according to the area control signal TCON_A<4:1>. Although FIG. 5 illustrates each of the column pulse signal CP_A<4:1>, the area control signal TCON_A<4:1> and the area column control signal CCNT_A<4:1> using a single signal line, each of the column pulse signal CP_A<4:1>, the area control signal TCON_A<4:1> and the area column control signal CCNT_A<4:1> use a plurality of signal lines (i.e., four signal lines) respectively corresponding to the bits (i.e., the first to fourth bits) included in each of the column pulse signal CP_A<4:1>, the area control signal TCON_A<4:1> and the area column control signal CCNT_A<4:1>. In such a case, the area column control signal generation circuit 6 may include a plurality of circuits, each of which has a substantially similar configuration as illustrated in FIG. 5.

The area column control signal generation circuit 6 may delay a first bit CP_A<1> of the column pulse signal CP_A<4:1> for the first delay period to generate a first bit signal CCNT_A<1> of the area column control signal CCNT_A<4:1> if the first bit signal TCON_A<1> of the area control signal TCON_A<4:1> has a logic "low" level. The area column control signal generation circuit 6 may delay the first bit CP_A<1> of the column pulse signal CP_A<4:1> for the second delay period to generate the first bit signal CCNT_A<1> of the area column control signal CCNT_A<4:1> if the first bit signal TCON_A<1> of the area control signal TCON_A<4:1> has a logic "high" level. If the error correction operation of the first area 821 is performed, the area column control signal generation circuit 6 may generate the first bit signal CCNT_A<1> which is created at a time that is delayed for a relatively longer delay period as compared to when the error correction operation of the first area 821 is not performed.

The area column control signal generation circuit 6 may delay a second bit CP_A<2> of the column pulse signal CP_A<4:1> for the first delay period to generate a second bit signal CCNT_A<2> of the area column control signal CCNT_A<4:1> if the second bit signal TCON_A<2> of the area control signal TCON_A<4:1> has a logic "low" level. The area column control signal generation circuit 6 may delay the second bit CP_A<2> of the column pulse signal CP_A<4:1> for the second delay period to generate the second bit signal CCNT_A<2> of the area column control signal CCNT_A<4:1> if the second bit signal TCON_A<2> of the area control signal TCON_A<4:1> has a logic "high" level. If the error correction operation of the second area 822 is performed, the area column control signal generation circuit 6 may generate the second bit signal CCNT_A<2> which is created at a time that is delayed a relatively longer delay period as compared to when the error correction operation of the second area 822 is not performed.

The area column control signal generation circuit 6 may delay a third bit CP_A<3> of the column pulse signal CP_A<4:1> for the first delay period to generate a third bit signal CCNT_A<3> of the area column control signal CCNT_A<4:1> if the third bit signal TCON_A<3> of the area control signal TCON_A<4:1> has a logic "low" level. The area column control signal generation circuit 6 may delay the third bit CP_A<3> of the column pulse signal CP_A<4:1> for the second delay period to generate the third bit signal CCNT_A<3> of the area column control signal CCNT_A<4:1> if the third bit signal TCON_A<3> of the area control signal TCON_A<4:1> has a logic "high" level. If the error correction operation of the third area 823 is performed, the area column control signal generation circuit 6 may generate the third bit signal CCNT_A<3> which is created at a time that is delayed a relatively longer delay period as compared to when the error correction operation of the third area 823 is not performed.

The area column control signal generation circuit 6 may delay a fourth bit CP_A<4> of the column pulse signal CP_A<4:1> for the first delay period to generate a fourth bit signal CCNT_A<4> of the area column control signal CCNT_A<4:1> if the fourth bit signal TCON_A<4> of the area control signal TCON_A<4:1> has a logic "low" level. The area column control signal generation circuit 6 may delay the fourth bit CP_A<4> of the column pulse signal CP_A<4:1> for the second delay period to generate the fourth bit signal CCNT_A<4> of the area column control signal CCNT_A<4:1> if the fourth bit signal TCON_A<4> of the area control signal TCON_A<4:1> has a logic "high" level. If the error correction operation of the fourth area 824 is performed, the area column control signal generation circuit 6 may generate the fourth bit signal CCNT_A<4> which is created at a time that is delayed a relatively longer delay period as compared to when the error correction operation of the fourth area 824 is not performed.

Figure 6:
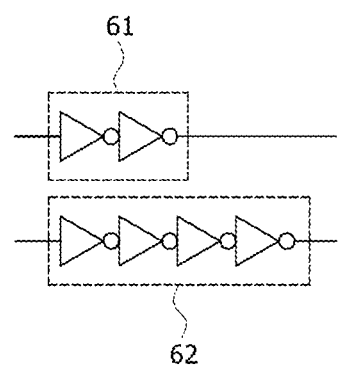
FIG. 6 is a circuit diagram illustrating a first delay circuit and a second delay circuit included in the area column control signal generation circuit of FIG. 5.

Referring to FIG. 6, a circuit diagram of the first delay circuit 61 and a circuit diagram of the second delay circuit 62 are illustrated. Each of the first delay circuit 61 and the second delay circuit 62 may be realized using an inverter chain. In the present embodiment, the number of inverters included in the second delay circuit 62 may be greater than the number of inverters included in the first delay circuit 61. The number of inverters included in the first delay circuit 61 may be set to be different according to the embodiment. In addition, the number of inverters included in the second delay circuit 62 may also be set to be different according to the embodiment.

Figure 7:
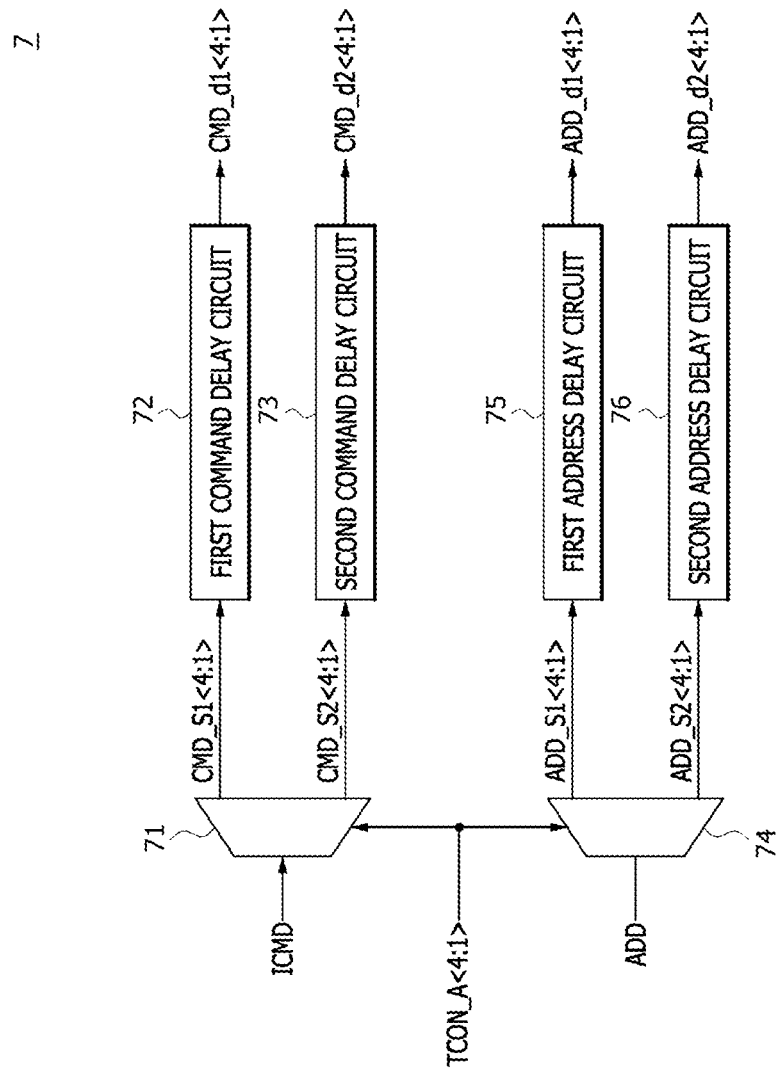
FIG. 7 illustrates an example of an area command/address generation circuit included in the electronic device of FIG. 1.

Referring to FIG. 7, the area command/address generation circuit 7 may include a first selector 71, a first command delay circuit 72, a second command delay circuit 73, a second selector 74, a first address delay circuit 75, and a second address delay circuit 76.

The first selector 71 may output the internal command ICMD as a first selection command CMD_ S1<4:1> or a second selection command CMD_S2<4:1> in response to the area control signals TCON_A<4:1>. Although FIG. 7 illustrates the first selector 71 using a single block, the first selector 71 may be realized using a plurality of circuits respectively corresponding to the bits included in each of the area control signal TCON_A<4:1>, the first selection command CMD_S1<4:1>, and the second selection command CMD_S2<4:1>. The first selector 71 may output the internal command ICMD as a datum of a first bit CMD_S1<1> of the first selection command CMD_S1<4:1> if the first bit signal TCON_A<1> of the area control signal TCON_A<4:1> has a logic "low" level. The first selector 71 may output the internal command ICMD as a datum of a first bit CMD_S2<1> of the second selection command CMD_S2<4:1> if the first bit signal TCON_A<1> of the area control signal TCON_A<4:1> has a logic "high" level. The first selector 71 may output the internal command ICMD as a datum of a second bit CMD_S1<2> of the first selection command CMD S1<4:1> if the second bit signal TCON_A<2> of the area control signal TCON_A<4:1> has a logic "low" level. The first selector 71 may output the internal command ICMD as a datum of a second bit CMD_S2<2> of the second selection command CMD S2<4:1> if the second bit signal TCON_A<2> of the area control signal TCON_A<4:1> has a logic "high" level. The first selector 71 may output the internal command ICMD as a datum of a third bit CMD_S1<3> of the first selection command CMD S1<4:1> if the third bit signal TCON_A<3> of the area control signal TCON_A<4:1> has a logic "low" level. The first selector 71 may output the internal command ICMD as a datum of a third bit CMD_S2<3> of the second selection command CMD_S2<4:1> if the third bit signal TCON_A<3> of the area control signal TCON_A<4:1> has a logic "high" level. The first selector 71 may output the internal command ICMD as a datum of a fourth bit CMD_S1<4> of the first selection command CMD_S1<4:1> if the fourth bit signal TCON_A<4> of the area control signal TCON_A<4:1> has a logic "low" level. The first selector 71 may output the internal command ICMD as a datum of a fourth bit CMD_S2<4> of the second selection command CMD_S2<4:1> if the fourth bit signal TCON_A<4> of the area control signal TCON_A<4:1> has a logic "high" level.

The first command delay circuit 72 may delay the first selection command CMD_S1<4:1> for a first delay period to generate a first delayed command CMD_d1<4:1>. Although FIG. 7 illustrates the first command delay circuit 72 using a single block, the first command delay circuit 72 may be realized using a plurality of circuits respectively corresponding to the bits included in each of the first selection command CMD_S1<4:1> and the first delayed command CMD_d1<4:1>. The first command delay circuit 72 may delay a datum of the first bit CMD_S1<1> of the first selection command CMD_S1<4:1> for the first delay period to generate a datum of a first bit CMD_d1<1> of the first delayed command CMD_d1<4:1>. The first command delay circuit 72 may delay a datum of the second bit CMD_S1<2> of the first selection command CMD_S1<4:1> for the first delay period to generate a datum of a second bit CMD_d1<2> of the first delayed command CMD_d1<4:1>. The first command delay circuit 72 may delay a datum of the third bit CMD_S1<3> of the first selection command CMD_S1<4:1> for the first delay period to generate a datum of a third bit CMD_d1<3> of the first delayed command CMD_d1<4:1>. The first command delay circuit 72 may delay a datum of the fourth bit CMD_S1<4> of the first selection command CMD_S1<4:1> for the first delay period to generate a datum of a fourth bit CMD_d1<4> of the first delayed command CMD_d1<4:1>.

The second command delay circuit 73 may delay the second selection command CMD_S2<4:1> for a second delay period to generate a second delayed command CMD_d2<4:1>. Although FIG. 7 illustrates the second command delay circuit 73 using a single block, the second command delay circuit 73 may be realized using a plurality of circuits respectively corresponding to the bits included in each of the second selection command CMD_S2<4:1> and the second delayed command CMD_d2<4:1>. The second command delay circuit 73 may delay a datum of the first bit CMD_S2<1> of the second selection command CMD_S2<4:1> for the second delay period to generate a datum of a first bit CMD_d2<1> of the second delayed command CMD_d2<4:1>. The second command delay circuit 73 may delay a datum of the second bit CMD_S2<2> of the second selection command CMD_S2<4:1> for the second delay period to generate a datum of a second bit CMD_d2<2> of the second delayed command CMD_d2<4:1>. The second command delay circuit 73 may delay a datum of the third bit CMD_S2<3> of the second selection command CMD_S2<4:1> for the second delay period to generate a datum of a third bit CMD_d2<3> of the second delayed command CMD_d2<4:1>. The second command delay circuit 73 may delay a datum of the fourth bit CMD_S2<4> of the second selection command CMD_S2<4:1> for the second delay period to generate a datum of a fourth bit CMD_d2<4> of the second delayed command CMD_d2<4:1>.

The second selector 74 may output the address ADD as a first selection address ADD_S1<4:1> or a second selection address ADD_S2<4:1> in response to the area control signal TCON_A<4:1>. Although FIG. 7 illustrates the second selector 74 using a single block, the second selector 74 may be realized using a plurality of circuits respectively corresponding to the bits included in each of the area control signal TCON_A<4:1>, the first selection address ADD_S1<4:1>, and the second selection address ADD_S2<4:1>. The second selector 74 may output the address ADD as a datum of a first bit ADD_S1<1> of the first selection address ADD_S1<4:1> if the first bit signal TCON_A<1> of the area control signal TCON_A<4:1> has a logic "low" level. The second selector 74 may output the address ADD as a datum of a first bit ADD_S2<1> of the second selection address ADD_S2<4:1> if the first bit signal TCON_A<1> of the area control signal TCON_A<4:1> has a logic "high" level. The second selector 74 may output the address ADD as a datum of a second bit ADD_S1<2> of the first selection address ADD_S1<4:1> if the second bit signal TCON_A<2> of the area control signal TCON_A<4:1> has a logic "low" level. The second selector 74 may output the address ADD as a datum of a second bit ADD_S2<2> of the second selection address ADD_S2<4:1> if the second bit signal TCON_A<2> of the area control signal TCON_A<4:1> has a logic "high" level. The second selector 74 may output the address ADD as a datum of a third bit ADD_S1<3> of the first selection address ADD_S1<4:1> if the third bit signal TCON_A<3> of the area control signal TCON_A<4:1> has a logic "low" level. The second selector 74 may output the address ADD as a datum of a third bit ADD_S2<3> of the second selection address ADD_S2<4:1> if the third bit signal TCON_A<3> of the area control signal TCON_A<4:1> has a logic "high" level. The second selector 74 may output the address ADD as a datum of a fourth bit ADD_S1<4> of the first selection address ADD_S1<4:1> if the fourth bit signal TCON_A<4> of the area control signal TCON_A<4:1> has a logic "low" level. The second selector 74 may output the address ADD as a datum of a fourth bit ADD_S2<4> of the second selection address ADD_S2<4:1> if the fourth bit signal TCON_A<4> of the area control signal TCON_A<4:1> has a logic "high" level.

The first address delay circuit 75 may delay the first selection address ADD_S1<4:1> for a first delay period to generate a first delayed address ADD_d1<4:1>. Although FIG. 7 illustrates the first address delay circuit 75 using a single block, the first address delay circuit 75 may be realized using a plurality of circuits respectively corresponding to the bits included in each of the first selection address ADD_S1<4:1> and the first delayed address ADD_d1<4:1>. The first address delay circuit 75 may delay a datum of the first bit ADD_S1<1> of the first selection address ADD_S1<4:1> for the first delay period to generate a datum of a first bit ADD_d1<1> of the first delayed address ADD_d1<4:1>. The first address delay circuit 75 may delay a datum of the second bit ADD_S1<2> of the first selection address ADD_S1<4:1> for the first delay period to generate a datum of a second bit ADD_d1<2> of the first delayed address ADD_d1<4:1>. The first address delay circuit 75 may delay a datum of the third bit ADD_S1<3> of the first selection address ADD_S1<4:1> for the first delay period to generate a datum of a third bit ADD_d1<3> of the first delayed address ADD_d1<4:1>. The first address delay circuit 75 may delay a datum of the fourth bit ADD_S1<4> of the first selection address ADD_S1<4:1> for the first delay period to generate a datum of a fourth bit ADD_d1<4> of the first delayed address ADD_d1<4:1>.

The second address delay circuit 76 may delay the second selection address ADD_S2<4:1> for a second delay period to generate a second delayed address ADD_d2<4:1>. Although FIG. 7 illustrates the second address delay circuit 76 using a single block, the second address delay circuit 76 may be realized using a plurality of circuits respectively corresponding to the bits included in each of the second selection address ADD_S2<4:1> and the second delayed address ADD_d2<4:1>. The second address delay circuit 76 may delay a datum of the first bit ADD_S2<1> of the second selection address ADD_S2<4:1> for the second delay period to generate a datum of a first bit ADD_d2<1> of the second delayed address ADD_d2<4:1>. The second address delay circuit 76 may delay a datum of the second bit ADD_S2<2> of the second selection address ADD_S2<4:1> for the second delay period to generate a datum of a second bit ADD_d2<2> of the second delayed address ADD_d2<4:1>. The second address delay circuit 76 may delay a datum of the third bit ADD_S2<3> of the second selection address ADD_S2<4:1> for the second delay period to generate a datum of a third bit ADD_d2<3> of the second delayed address ADD_d2<4:1>. The second address delay circuit 76 may delay a datum of the fourth bit ADD_S2<4> of the second selection address ADD_S2<4:1> for the second delay period to generate a datum of a fourth bit ADD_d2<4> of the second delayed address ADD_d2<4:1>.

The area command/address generation circuit 7 may delay the internal command ICMD and the address ADD to generate the first delayed command CMD_d1<4:1>, the second delayed command CMD_d2<4:1>, the first delayed address ADD_d1<4:1>, and the second delayed address ADD_d2<4:1>, according to whether the error correction operation is performed in each of the areas 821, 822, 823 and 824. For example, if the error correction operation is performed in the first and second areas 821 and 822 and the error correction operation is not performed in the third and fourth areas 823, and 824, the area command/address generation circuit 7 may delay the internal command ICMD for the first delay period to generate data of the third and fourth bits CMD_d1<4:3> of the first delayed command CMD_d1<4:1> and may delay the internal command ICMD for the second delay period to generate data of the first and second bits CMD_d2<2:1> of the second delayed command CMD_d2<4:1>. In addition, the area command/address generation circuit 7 may delay the address ADD for the first delay period to generate data of the third and fourth bits ADD_d1<4:3> of the first delayed address ADD_d1<4:1> and may delay the address ADD for the second delay period to generate data of the first and second bits ADD_d2<2:1> of the second delayed address ADD_d2<4:1>. The area command/address generation circuit 7 may generate the second delayed command CMD_d2<4:1> and the second delayed address ADD_d2<4:1> by delaying the internal command ICMD and the address ADD for a relatively longer delay period for the areas performing the error correction operation, as compared to the areas in which the error correction operation is not performed.

Figure 8:
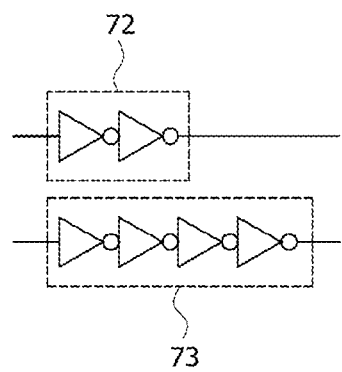
FIG. 8 is a circuit diagram illustrating a first command delay circuit and a second command delay circuit included in the area command/address generation circuit of FIG. 7.

Referring to FIG. 8, a circuit diagram of the first command delay circuit 72 and a circuit diagram of the second command delay circuit 73 are illustrated. Each of the first and second command delay circuits 72 and 73 may be realized using an inverter chain. In the present embodiment, the number of inverters included in the second command delay circuit 73 may be greater than the number of inverters included in the first command delay circuit 72. The number of inverters included in the first command delay circuit 72 may be set to be different according to the embodiment. In addition, the number of inverters included in the second command delay circuit 73 may also be set to be different according to the embodiment.

Figure 9:
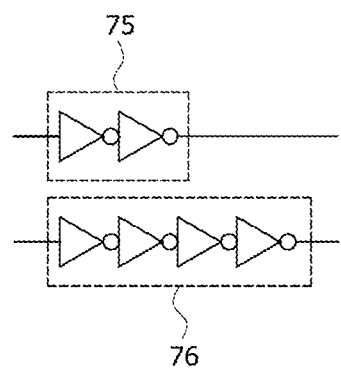
FIG. 9 is a circuit diagram illustrating a first address delay circuit and a second address delay circuit included in the area command/address generation circuit of FIG. 7.

Referring to FIG. 9, a circuit diagram of the first address delay circuit 75 and a circuit diagram of the second address delay circuit 76 are illustrated. Each of the first and second address delay circuits 75 and 76 may be realized using an inverter chain. In the present embodiment, the number of inverters included in the second address delay circuit 76 may be greater than the number of inverters included in the first address delay circuit 75. The number of inverters included in the first address delay circuit 75 may be set to be different according to the embodiment. In addition, the number of inverters included in the second address delay circuit 76 may also be set to be different according to the embodiment.

Figure 10:
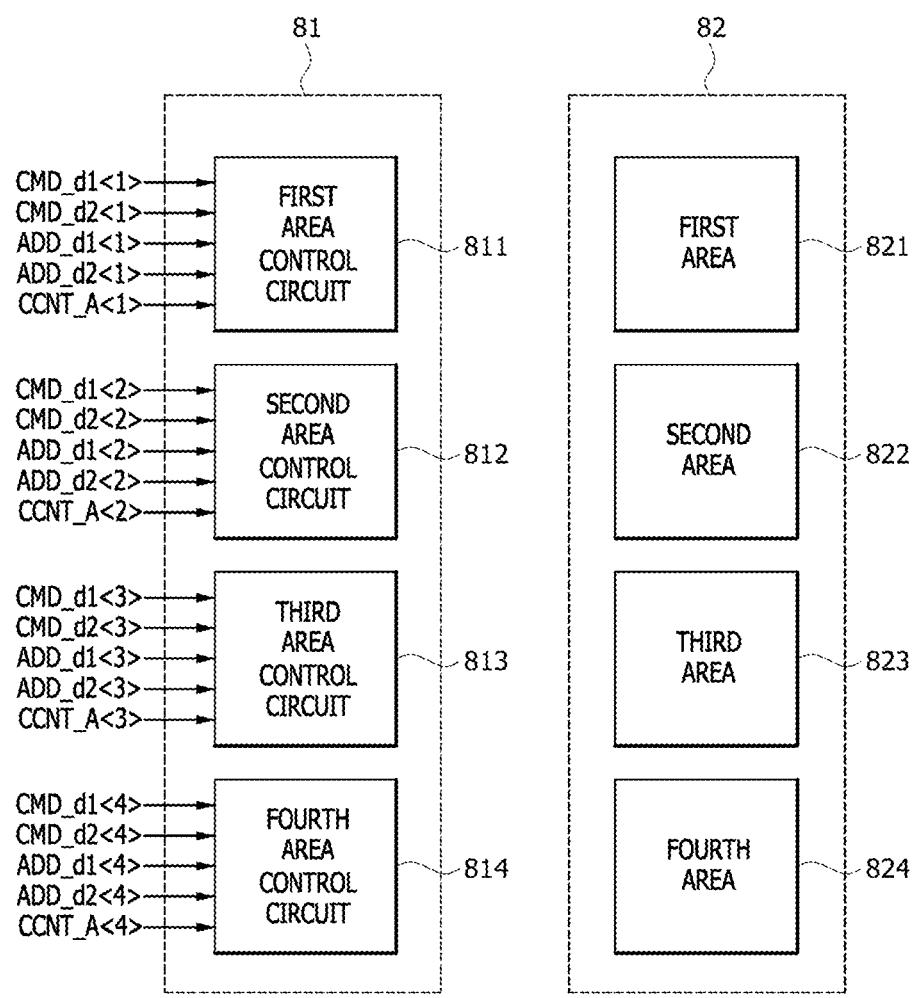
FIG. 10 is a block diagram illustrating an example of a core circuit included in the electronic device of FIG. 1.

Referring to FIG. 10, the core circuit 8 may include a column control circuit 81 and a cell array 82. The column control circuit 81 may include a first area control circuit 811, a second area control circuit 812, a third area control circuit 813, and a fourth area control circuit 814. The cell array 82 may include the first to fourth areas 821, 822, 823, and 824.

The first area control circuit 811 may perform the column operation of, on, or associated with the first area 821 in response to a datum of the first bit CMD_d1<1> of the first delayed command CMD_d1<4:1>, a datum of the first bit CMD_d2<1> of the second delayed command CMD_d2<4:

1>, a datum of the first bit ADD_d1<1> of the first delayed address ADD_d1<4:1>, a datum of the first bit ADD_d2<1> of the second delayed address ADD_d2<4:1>, and a datum of the first bit signal CCNT_A<1> of the area column control signal CCNT_A<4:1>. The first area control circuit 811 may perform the column operation of the first area 821 in response to the datum of the first bit CMD_d1<1> of the first delayed command CMD_d1<4:1> and the datum of the first bit ADD_d1<1> of the first delayed address ADD_d1<4:1> when a pulse of the first bit signal CCNT_A<1> of the area column control signal CCNT_A<4:1> is created if the error correction operation of the first area 821 is not performed. The first area control circuit 811 may perform the column operation of the first area 821 in response to the datum of the first bit CMD_d2<1> of the second delayed command CMD_d2<4:1> and the datum of the first bit ADD_d2<1> of the second delayed address ADD_d2<4:1> when a pulse of the first bit signal CCNT_A<1> of the area column control signal CCNT_A<4:1> is created if the error correction operation of the first area 821 is performed. If the error correction operation of the first area 821 is performed, the first area control circuit 811 may perform the column operation of the first area 821 in response to the datum of the first bit CMD_d2<1> and the datum of the first bit ADD_d2<1> which are generated relatively later as compared to when the error correction operation of the first area 821 is not performed. The first area control circuit 811 may control a speed of the column operation whether or not the error correction operation of the first area 821 is performed. The first area control circuit 811 may more readily set a speed of the column operation of the first area 821 according to an operation condition of the first area 821.

The second area control circuit 812 may perform the column operation of the second area 822 in response to a datum of the second bit CMD_d1<2> of the first delayed command CMD_d1<4:1>, a datum of the second bit CMD_d2<2> of the second delayed command CMD_d2<4:1>, a datum of the second bit ADD_d1<2> of the first delayed address ADD_d1<4:1>, a datum of the second bit ADD_d2<2> of the second delayed address ADD_d2<4:1>, and a datum of the second bit signal CCNT_A<2> of the area column control signal CCNT_A<4:1>. The second area control circuit 812 may perform the column operation of the second area 822 in response to the datum of the second bit CMD_d1<2> of the first delayed command CMD_d1<4:1> and the datum of the second bit ADD_d1<2> of the first delayed address ADD_d1<4:1> when a pulse of the second bit signal CCNT_A<2> of the area column control signal CCNT_A<4:1> is created if the error correction operation of the second area 822 is not performed. The second area control circuit 812 may perform the column operation of the second area 822 in response to the datum of the second bit CMD_d2<2> of the second delayed command CMD_d2<4:1> and the datum of the second bit ADD_d2<2> of the second delayed address ADD_d2<4:1> when a pulse of the second bit signal CCNT_A<2> of the area column control signal CCNT_A<4:1> is created if the error correction operation of the second area 822 is performed. If the error correction operation of the second area 822 is performed, the second area control circuit 812 may perform the column operation of the second area 822 in response to the datum of the second bit CMD_d2<2> and the datum of the second bit ADD_d2<2> which are generated relatively later as compared to when the error correction operation of the second area 822 is not performed. The second area control circuit 812 may control a speed of the column operation whether or not the error correction operation of the second area 822 is performed. The second area control circuit 812 may more readily set a speed of the column operation of the second area 822 according to an operation condition of the second area 822.

The third area control circuit 813 may perform the column operation of the third area 823 in response to a datum of the third bit CMD_d1<3> of the first delayed command CMD_d1<4:1>, a datum of the third bit CMD_d2<3> of the second delayed command CMD_d2<4:1>, a datum of the third bit ADD_d1<3> of the first delayed address ADD_d1<4:1>, a datum of the third bit ADD_d2<3> of the second delayed address ADD_d2<4:1>, and a datum of the third bit signal CCNT_A<3> of the area column control signal CCNT_A<4:1>. The third area control circuit 813 may perform the column operation of the third area 823 in response to the datum of the third bit CMD_d1<3> of the first delayed command CMD_d1<4:1> and the datum of the third bit ADD_d1<3> of the first delayed address ADD_d1<4:1> when a pulse of the third bit signal CCNT_A<3> of the area column control signal CCNT_A<4:1> is created if the error correction operation of the third area 823 is not performed. The third area control circuit 813 may perform the column operation of the third area 823 in response to the datum of the third bit CMD_d2<3> of the second delayed command CMD_d2<4:1> and the datum of the third bit ADD_d2<3> of the second delayed address ADD_d2<4:1> when a pulse of the third bit signal CCNT_A<3> of the area column control signal CCNT_A<4:1> is created if the error correction operation of the third area 823 is performed. If the error correction operation of the third area 823 is performed, the third area control circuit 813 may perform the column operation of the third area 823 in response to the datum of the third bit CMD_d2<3> and the datum of the third bit ADD_d2<3> which are generated relatively later as compared to when the error correction operation of the third area 823 is not performed. The third area control circuit 813 may control a speed of the column operation whether or not the error correction operation of the third area 823 is performed. The third area control circuit 813 may more readily set a speed of the column operation of the third area 823 according to an operation condition of the third area 823.

The fourth area control circuit 814 may perform the column operation of the fourth area 824 in response to a datum of the fourth bit CMD_d1<4> of the first delayed command CMD_d1<4:1>, a datum of the fourth bit CMD_d2<4> of the second delayed command CMD_d2<4:1>, a datum of the fourth bit ADD_d1<4> of the first delayed address ADD_d1<4:1>, a datum of the fourth bit ADD_d2<4> of the second delayed address ADD_d2<4:1>, and a datum of the fourth bit signal CCNT_A<4> of the area column control signal CCNT_A<4:1>. The fourth area control circuit 814 may perform the column operation of the fourth area 824 in response to the datum of the fourth bit CMD_d1<4> of the first delayed command CMD_d1<4:1> and the datum of the fourth bit ADD_d1<4> of the first delayed address ADD_d1<4:1> when a pulse of the fourth bit signal CCNT_A<4> of the area column control signal CCNT_A<4:1> is created if the error correction operation of the fourth area 824 is not performed. The fourth area control circuit 814 may perform the column operation of the fourth area 824 in response to the datum of the fourth bit CMD_d2<4> of the second delayed command CMD_d2<4:1> and the datum of the fourth bit ADD_d2<4> of the second delayed address ADD_d2<4:1> when a pulse of the fourth bit signal CCNT_A<4> of the area column control signal CCNT_A<4:1> is created if the error correction operation of the fourth area 824 is performed. If the error correction operation of the fourth area 824 is performed, the fourth area control circuit 814 may perform the column operation of the fourth area 824 in response to the datum of the fourth bit CMD_d2<4> and the datum of the fourth bit ADD_d2<4> which are generated relatively later as compared to when the error correction operation of the fourth area 824 is not performed. The fourth area control circuit 814 may control a speed of the column operation whether or not the error correction operation of the fourth area 824 is performed. The fourth area control circuit 814 may more readily set a speed of the column operation of the fourth area 824 according to an operation condition of the fourth area 824.

Figure 11:
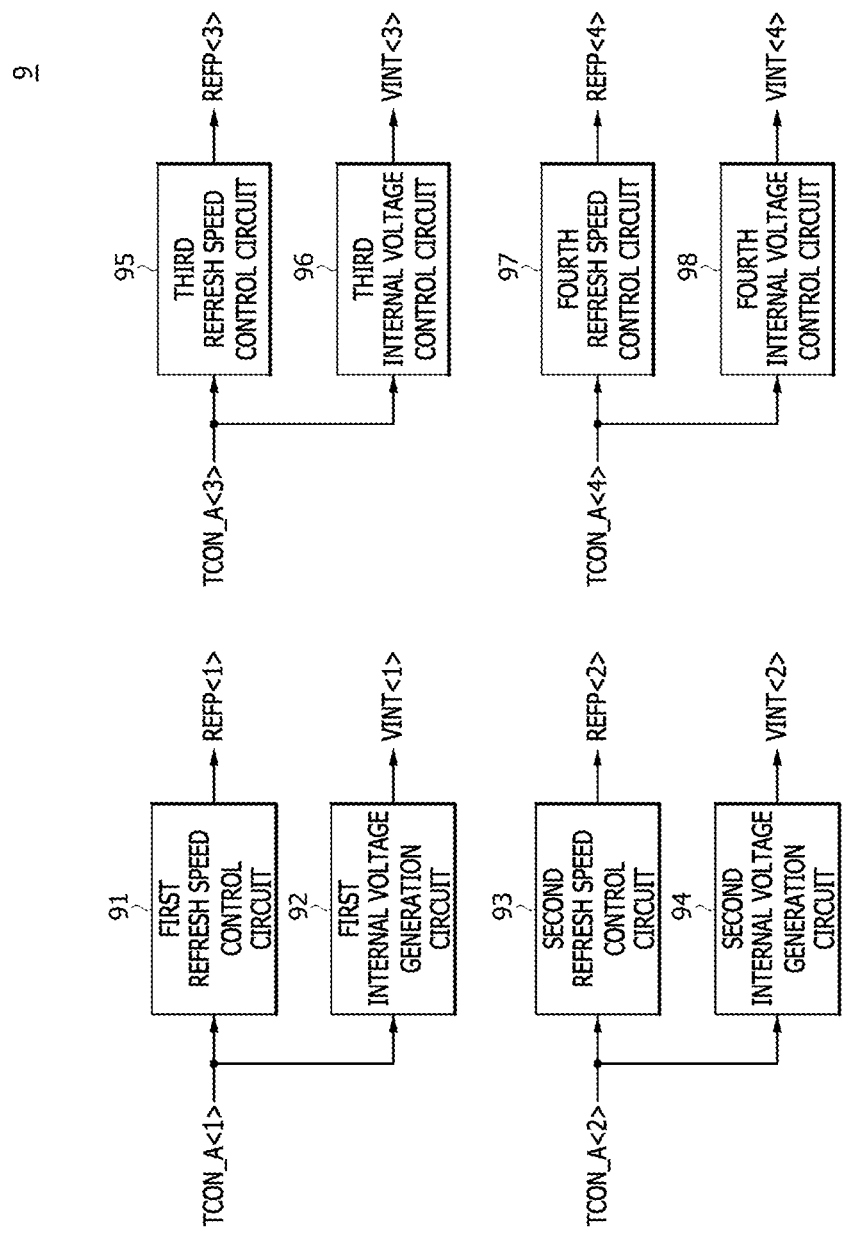
FIG. 11 is a block diagram illustrating an example of an operation control circuit included in the electronic device of FIG. 1.

Referring to FIG. 11, the operation control circuit 9 may include a first refresh speed control circuit 91, a first internal voltage generation circuit 92, a second refresh speed control circuit 93, a second internal voltage generation circuit 94, a third refresh speed control circuit 95, a third internal voltage generation circuit 96, a fourth refresh speed control circuit 97, and a fourth internal voltage generation circuit 98.

The first refresh speed control circuit 91 may generate a first bit signal REFP<1> (i.e., a first refresh pulse signal) of the refresh pulse signal REFP<4:1> in response to the first bit signal TCON_A<1> of the area control signal TCON_A<4:1>. The first refresh speed control circuit 91 may generate the first refresh pulse signal REFP<1> having a first operation cycle time if the first bit signal TCON_A<1> of the area control signal TCON_A<4:1> has a logic "low" level to not perform the error correction operation of the first area 821. The first operation cycle time may correspond to a predetermined cycle time stored in the electronic device. The first refresh speed control circuit 91 may generate the first refresh pulse signal REFP<1> having a second operation cycle time if the first bit signal TCON_A<1> of the area control signal TCON_A<4:1> has a logic "high" level to perform the error correction operation of the first area 821. In the present embodiment, the second operation cycle time may be set to be greater than the first operation cycle time. If the error correction operation of the first area 821 is performed, the first refresh speed control circuit 91 may reduce a refresh operation speed as compared to when the error correction operation of the first area 821 is not performed. As a result, the electric power consumed during a refresh operation may be reduced.

The first internal voltage generation circuit 92 may generate a first bit signal VINT<1> (i.e., a first internal voltage signal) of the internal voltage signal VINT<4:1> in response to the first bit signal TCON_A<1> of the area control signal TCON_A<4:1>. The first internal voltage generation circuit 92 may generate the first internal voltage signal VINT<1> having a first voltage level if the first bit signal TCON_A<1> of the area control signal TCON_A<4:1> has a logic "low" level to not perform the error correction operation of the first area 821. The first voltage level may correspond to a predetermined voltage level stored in the electronic device. The first internal voltage generation circuit 92 may generate the first internal voltage signal VINT<1> having a second voltage level if the first bit signal TCON_A<1> of the area control signal TCON_A<4:1> has a logic "high" level to perform the error correction operation of the first area 821. In the present embodiment, the second voltage level may be set to be lower than the first voltage level. If the error correction operation of the first area 821 is performed, the first internal voltage generation circuit 92 may lower a voltage level of the first internal voltage signal VINT<1> as compared to when the error correction operation of the first area 821 is not performed. As a result, the electric power consumption of the electronic device may be reduced.

The second refresh speed control circuit 93 may generate a second bit signal REFP<2> (i.e., a second refresh pulse signal) of the refresh pulse signal REFP<4:1> in response to the second bit signal TCON_A<2> of the area control signal TCON_A<4:1>. The second refresh speed control circuit 93 may generate the second refresh pulse signal REFP<2> having the first operation cycle time if the second bit signal TCON_A<2> of the area control signal TCON_A<4:1> has a logic "low" level to not perform the error correction operation of the second area 822. The second refresh speed control circuit 93 may generate the second refresh pulse signal REFP<2> having the second operation cycle time if the second bit signal TCON_A<2> of the area control signal TCON_A<4:1> has a logic "high" level to perform the error correction operation of the second area 822. In the present embodiment, the second operation cycle time may be set to be greater than the first operation cycle time. If the error correction operation of the second area 822 is performed, the second refresh speed control circuit 93 may reduce a refresh operation speed as compared to when the error correction operation of the second area 822 is not performed. As a result, the electric power consumed during the refresh operation may be reduced.

The second internal voltage generation circuit 94 may generate a second bit signal VINT<2> (i.e., a second internal voltage signal) of the internal voltage signal VINT<4:1> in response to the second bit signal TCON_A<2> of the area control signal TCON_A<4:1>. The second internal voltage generation circuit 94 may generate the second internal voltage signal VINT<2> having the first voltage level if the second bit signal TCON_A<2> of the area control signal TCON_A<4:1> has a logic "low" level to not perform the error correction operation of the second area 822. The second internal voltage generation circuit 94 may generate the second internal voltage signal VINT<2> having the second voltage level if the second bit signal TCON_A<2> of the area control signal TCON_A<4:1> has a logic "high" level to perform the error correction operation of the second area 822. In the present embodiment, the second voltage level may be set to be lower than the first voltage level. If the error correction operation of the second area 822 is performed, the second internal voltage generation circuit 94 may lower a voltage level of the second internal voltage signal VINT<2> as compared to when the error correction operation of the second area 822 is not performed. As a result, the electric power consumption of the electronic device may be reduced.

The third refresh speed control circuit 95 may generate a third bit signal REFP<3> (i.e., a third refresh pulse signal) of the refresh pulse signal REFP<4:1> in response to the third bit signal TCON_A<3> of the area control signal TCON_A<4:1>. The third refresh speed control circuit 95 may generate the third refresh pulse signal REFP<3> having the first operation cycle time if the third bit signal TCON_A<3> of the area control signal TCON_A<4:1> has a logic "low" level to not perform the error correction operation of the third area 823. The third refresh speed control circuit 95 may generate the third refresh pulse signal REFP<3> having the second operation cycle time if the third bit signal TCON_A<3> of the area control signal TCON_A<4:1> has a logic "high" level to perform the error correction operation of the third area 823. In the present embodiment, the second operation cycle time may be set to be greater than the first operation cycle time. If the error correction operation of the third area 823 is performed, the third refresh speed control circuit 95 may reduce a refresh operation speed as compared to when the error correction operation of the third area 823 is not performed. As a result, the electric power consumed during the refresh operation may be reduced.

The third internal voltage generation circuit 96 may generate a third bit signal VINT<3> (i.e., a third internal voltage signal) of the internal voltage signal VINT<4:1> in response to the third bit signal TCON_A<3> of the area control signal TCON_A<4:1>. The third internal voltage generation circuit 96 may generate the third internal voltage signal VINT<3> having the first voltage level if the third bit signal TCON_A<3> of the area control signal TCON_A<4:1> has a logic "low" level to not perform the error correction operation of the third area 823. The third internal voltage generation circuit 96 may generate the third internal voltage signal VINT<3> having the second voltage level if the third bit signal TCON_A<3> of the area control signal TCON_A<4:1> has a logic "high" level to perform the error correction operation of the third area 823. In the present embodiment, the second voltage level may be set to be lower than the first voltage level. If the error correction operation of the third area 823 is performed, the third internal voltage generation circuit 96 may lower a voltage level of the third internal voltage signal VINT<3> as compared to when the error correction operation of the third area 823 is not performed. As a result, the electric power consumption of the electronic device may be reduced.

The fourth refresh speed control circuit 97 may generate a fourth bit signal REFP<4> (i.e., a fourth refresh pulse signal) of the refresh pulse signal REFP<4:1> in response to the fourth bit signal TCON_A<4> of the area control signal TCON_A<4:1>. The fourth refresh speed control circuit 97 may generate the fourth refresh pulse signal REFP<4> having the first operation cycle time if the fourth bit signal TCON_A<4> of the area control signal TCON_A<4:1> has a logic "low" level to not perform the error correction operation of the fourth area 824. The fourth refresh speed control circuit 97 may generate the fourth refresh pulse signal REFP<4> having the second operation cycle time if the fourth bit signal TCON_A<4> of the area control signal TCON_A<4:1> has a logic "high" level to perform the error correction operation of the fourth area 824. In the present embodiment, the second operation cycle time may be set to be greater than the first operation cycle time. If the error correction operation of the fourth area 824 is performed, the fourth refresh speed control circuit 97 may reduce a refresh operation speed as compared to when the error correction operation of the fourth area 824 is not performed. As a result, the electric power consumed during the refresh operation may be reduced.

The fourth internal voltage generation circuit 98 may generate a fourth bit signal VINT<4> (i.e., a fourth internal voltage signal) of the internal voltage signal VINT<4:1> in response to the fourth bit signal TCON_A<4> of the area control signal TCON_A<4:1>. The fourth internal voltage generation circuit 98 may generate the fourth internal voltage signal VINT<4> having the first voltage level if the fourth bit signal TCON_A<4> of the area control signal TCON_A<4:1> has a logic "low" level to not perform the error correction operation of the fourth area 824. The fourth internal voltage generation circuit 98 may generate the fourth internal voltage signal VINT<4> having the second voltage level if the fourth bit signal TCON_A<4> of the area control signal TCON_A<4:1> has a logic "high" level to perform the error correction operation of the fourth area 824. In the present embodiment, the second voltage level may be set to be lower than the first voltage level. If the error correction operation of the fourth area 824 is performed, the fourth internal voltage generation circuit 98 may lower a voltage level of the fourth internal voltage signal VINT<4> as compared to when the error correction operation of the fourth area 824 is not performed. As a result, the electric power consumption of the electronic device may be reduced.

As described above, whether error correction operations of a plurality of cell areas included in a core circuit are performed may be distinguished according a mode register write operation to reduce power consumption of an electronic device including the core circuit.

In addition, a time that a column operation is performed may be controlled according to whether the error correction operations of the cell areas are performed. Accordingly, a speed of the column operation may be more readily set according to an operation condition of the cell area in which the error correction operation is performed.

Moreover, a refresh operation speed may be controlled according to whether the error correction operation is performed. Thus, the electric power consumed during the refresh operation may be reduced.

Furthermore, a level of an internal voltage signal may be controlled according to whether the error correction operation is performed. Hence, the electric power consumption of the electronic device may be reduced.

Figure 12:
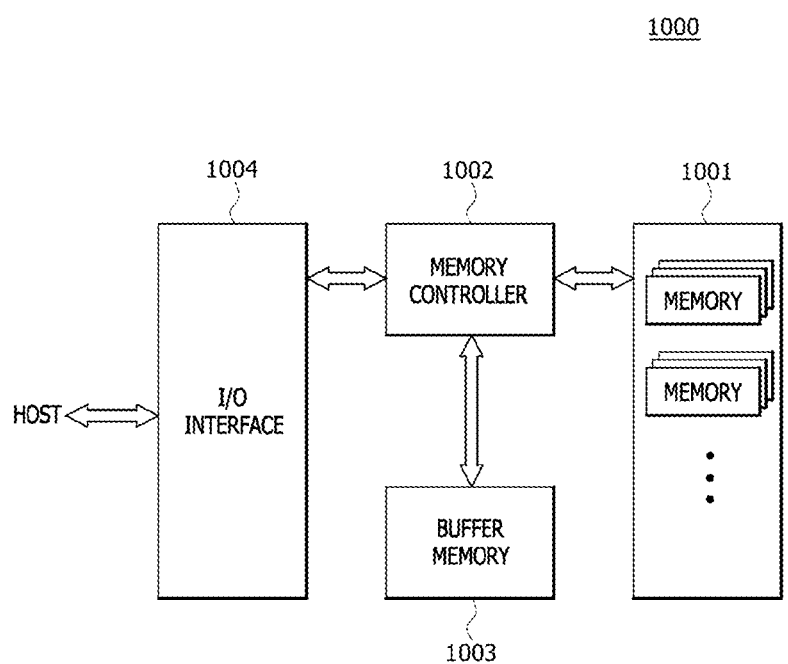
FIG. 12 is a block diagram illustrating a configuration of an electronic system employing the electronic device shown in FIG. 1.

The electronic device described with reference to FIGS. 1 to 11 may be applied to an electronic system that includes a memory system, a graphic system, a computing system, a mobile system, or the like. For example, as illustrated in FIG. 12, an electronic system 1000 according an embodiment may include a data storage circuit 1001, a memory controller 1002, a buffer memory 1003, and an input/output (I/O) interface 1004.

The data storage circuit 1001 may store data which is outputted from the memory controller 1002 or may read and output the stored data to the memory controller 1002, according to a control signal outputted from the memory controller 1002. The data storage circuit 1001 may include the electronic device illustrated in FIG. 1. Meanwhile, the data storage circuit 1001 may include a nonvolatile memory that can retain stored data even when its power supply is interrupted. The nonvolatile memory may be a flash memory such as a NOR-type flash memory or a NAND-type flash memory, a phase change random access memory (PRAM), a resistive random access memory (RRAM), a spin transfer torque random access memory (STTRAM), a magnetic random access memory (MRAM), or the like.

The memory controller 1002 may receive a command outputted from an external device (e.g., a host device) through the I/O interface 1004 and may decode the command outputted from the host device to control an operation for inputting data into the data storage circuit 1001 or the buffer memory 1003 or for outputting the data stored in the data storage circuit 1001 or the buffer memory 1003. Although FIG. 12 illustrates the memory controller 1002 with a single block, the memory controller 1002 may include one controller for controlling the data storage circuit 1001 and another controller for controlling the buffer memory 1003 comprised of a volatile memory.

The buffer memory 1003 may temporarily store the data which is processed by the memory controller 1002. That is, the buffer memory 1003 may temporarily store the data which is outputted from or inputted to the data storage circuit 1001. The buffer memory 1003 may store the data, which is outputted from the memory controller 1002, according to a control signal. The buffer memory 1003 may read and output the stored data to the memory controller 1002. The buffer memory 1003 may include a volatile memory such as a dynamic random access memory (DRAM), a mobile DRAM, or a static random access memory (SRAM).

The I/O interface 1004 may physically and electrically connect the memory controller 1002 to the external device (i.e., the host). Thus, the memory controller 1002 may receive control signals and data supplied from the external device (i.e., the host) through the I/O interface 1004 and may output the data outputted from the memory controller 1002 to the external device (i.e., the host) through the I/O interface 1004. That is, the electronic system 1000 may communicate with the host through the I/O interface 1004. The I/O interface 1004 may include any one of various interface protocols such as a universal serial bus (USB), a multimedia card (MMC), a peripheral component interconnect-express (PCI-E), a serial attached SCSI (SAS), a serial AT attachment (SATA), a parallel AT attachment (PATA), a small computer system interface (SCSI), an enhanced small device interface (ESDI), and an integrated drive electronics (IDE).

The electronic system 1000 may be used as an auxiliary storage device of the host or an external storage device. The electronic system 1000 may include a solid state disk (SSD), a USB memory, a secure digital (SD) card, a mini secure digital (mSD) card, a micro secure digital (micro SD) card, a secure digital high capacity (SDHC) card, a memory stick card, a smart media (SM) card, a multi-media card (MMC), an embedded multi-media card (eMMC), a compact flash (CF) card, or the like.

Figure 13:
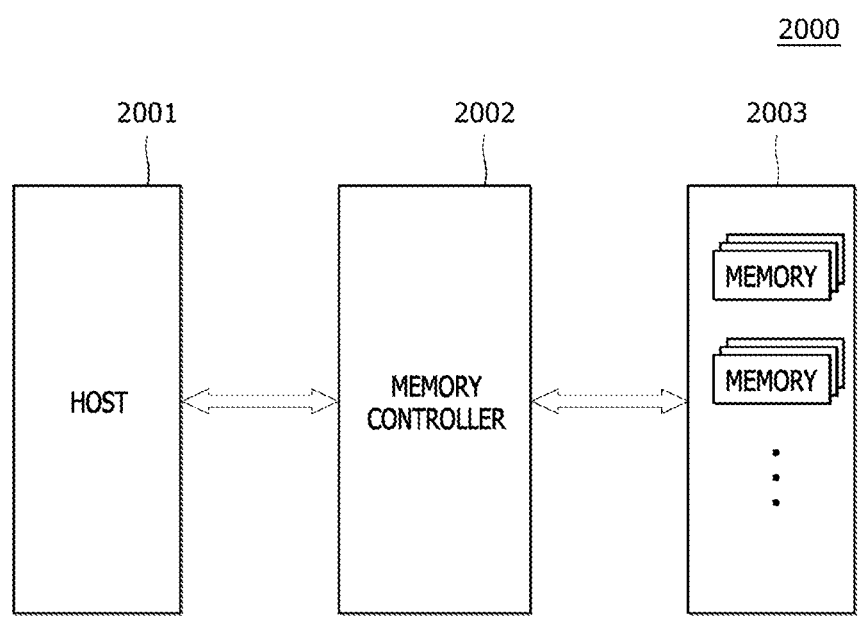
FIG. 13 is a block diagram illustrating a configuration of another electronic system employing the electronic device shown in FIG. 1.

Referring to FIG. 13, an electronic system 2000 according another embodiment may include a host 2001, a memory controller 2002, and a data storage circuit 2003.

The host 2001 may output a request signal and data to the memory controller 2002 to access the data storage circuit 2003. The memory controller 2002 may supply the data, a data strobe signal, a command, an address, and a clock signal to the data storage circuit 2003 in response to the request signal, and the data storage circuit 2003 may execute a write operation or a read operation in response to the command. The host 2001 may transmit the data to the memory controller 2002 to store the data into the data storage circuit 2003. In addition, the host 2001 may receive the data outputted from the data storage circuit 2003 through the memory controller 2002. The host 2001 may include a circuit that corrects data errors using an error correction code (ECC) circuit.

The memory controller 2002 may act as an interface that connects the host 2001 to the data storage circuit 2003 for communication between the host 2001 and the data storage circuit 2003. The memory controller 2002 may receive the request signal and the data from the host 2001 and may generate and supply the data, the data strobe signal, the command, the address, and the clock signal to the data storage circuit 2003 in order to control operations of the data storage circuit 2003. In addition, the memory controller 2002 may supply the data outputted from the data storage circuit 2003 to the host 2001.

The data storage circuit 2003 may include a plurality of memories. The data storage circuit 2003 may receive the data, the data strobe signal, the command, the address, and the clock signal from the memory controller 2002 to execute the write operation or the read operation. Each of the memories included in the data storage circuit 2003 may include a circuit that corrects the errors of the data using an error correction code (ECC) circuit. The data storage circuit 2003 may include the electronic device illustrated in FIG. 1.

In some embodiments, the electronic system 2000 may be realized to selectively operate any one of the ECC circuits included in the host 2001 and the data storage circuit 2003. Alternatively, the electronic system 2000 may be realized to simultaneously operate all of the ECC circuits included in the host 2001 and the data storage circuit 2003. The host 2001 and the memory controller 2002 may be realized in a single chip according to the embodiment. The memory controller 2002 and the data storage circuit 2003 may be realized in a single chip according to the embodiment.

What is claimed is:

1. An electronic device comprising:
    an area control signal generation circuit configured to generate an area control signal in response to an operation control signal and an internal information signal, wherein the area control signal includes information on whether each of a plurality of cell areas performs an error correction operation; and
    an area column control signal generation circuit configured to delay a column pulse signal for a delay period, which is determined according to the area control signal, to generate an area column control signal that controls a column operation of the plurality of cell areas.

2. The electronic device of claim 1,
    wherein the operation control signal is enabled to perform the error correction operation; and
    wherein the operation control signal is generated in response to a signal provided by an external device or is generated in the electronic device.

3. The electronic device of claim 1, wherein the internal information signal is extracted and generated from an information signal if a mode register write operation is performed.

4. The electronic device of claim 1,
    wherein the plurality of cell areas include a first area and a second area;
    wherein the error correction operation of the first area is performed if bits included in the internal information signal have a first logic level combination; and
    wherein the error correction operation of the second area is performed if the bits included in the internal information signal have a second logic level combination.

5. The electronic device of claim 1,
    wherein the plurality of cell areas include a first area and a second area;
    wherein the area control signal includes a first area control signal corresponding to a first bit signal of the area control signal and a second area control signal corresponding to a second bit signal of the area control signal;
    wherein the area control signal generation circuit generates the first area control signal which is enabled to perform the error correction operation of the first area; and
    wherein the area control signal generation circuit generates the second area control signal which is enabled to perform the error correction operation of the second area.

6. The electronic device of claim 1,
    wherein the area column control signal generation circuit delays the column pulse signal for a first delay period to generate the area column control signal, if the area control signal has a first logic level combination; and wherein the area column control signal generation circuit delays the column pulse signal for a second delay period to generate the area column control signal, if the area control signal has a second logic level combination.

7. The electronic device of claim 6, wherein if bits included in the area control signal have the second logic level combination, the error correction operation is performed in an area corresponding to the second logic level combination of the area control signal among the plurality of cell areas and the second delay period is set to be longer than the first delay period.

8. The electronic device of claim 1, further comprising an area command/address generation circuit configured to generate a first delayed command, a second delayed command, a first delayed address and a second delayed address by delaying an internal command and an address for a predetermined delay period which is determined according to the area control signal.

9. The electronic device of claim 8, wherein the area command/address generation circuit includes:
a selector configured to output the internal command as a first selection command or a second selection command in response to the area control signal;
a first command delay circuit configured to delay the first selection command for a first delay period to generate the first delayed command; and
a second command delay circuit configured to delay the second selection command for a second delay period to generate the second delayed command.

10. The electronic device of claim 8, wherein the area command/address generation circuit includes:
a selector configured to output the address as a first selection address or a second selection address in response to the area control signal;
a first address delay circuit configured to delay the first selection address for a first delay period to generate the first delayed address; and
a second address delay circuit configured to delay the second selection address for a second delay period to generate the second delayed address.

11. The electronic device of claim 8, further comprising a core circuit configured to control the column operation of the plurality of cell areas in response to the first and second delayed commands, the first and second delayed addresses, and the area column control signal.

12. The electronic device of claim 1, further comprising an operation control circuit configured to control a refresh cycle time of each of the plurality of cell areas or to control a voltage level of an internal voltage signal of each of the plurality of cell areas, according to the area control signal.

13. The electronic device of claim 12, wherein the operation control circuit is configured to increase the refresh cycle time of the cell area performing the error correction operation.

14. The electronic device of claim 12, wherein the operation control circuit is configured to lower a voltage level of the internal voltage signal of the cell area performing the error correction operation.

15. The electronic device of claim 12, wherein the operation control circuit is configured so that the refresh cycle time of the cell area not performing the error correction operation has a predetermined cycle time and a voltage level of the internal voltage signal of the cell area not performing the error correction operation has a predetermined level.

16. An electronic device comprising:
an area control signal generation circuit configured to generate an area control signal in response to an operation control signal and an internal information signal, wherein the area control signal includes information on whether each of a plurality of cell areas performs an error correction operation; and
an operation control circuit configured to control a refresh cycle time of each of the plurality of cell areas or to control a voltage level of an internal voltage signal of each of the plurality of cell areas, according to the area control signal.

17. The electronic device of claim 16,
wherein the operation control signal is enabled to perform the error correction operation; and
wherein the operation control signal is generated in response to a signal provided by an external device or is generated in response to a signal generated in the electronic device.

18. The electronic device of claim 16, wherein the internal information signal is extracted and generated from an information signal if a mode register write operation is performed.

19. The electronic device of claim 16,
wherein the plurality of cell areas include a first area and a second area;
wherein the error correction operation of the first area is performed if bits included in the internal information signal have a first logic level combination; and
wherein the error correction operation of the second area is performed if the bits included in the internal information signal have a second logic level combination.

20. The electronic device of claim 16,
wherein the plurality of cell areas include a first area and a second area;
wherein the area control signal includes a first area control signal corresponding to a first bit signal of the area control signal and a second area control signal corresponding to a second bit signal of the area control signal;
wherein the area control signal generation circuit generates the first area control signal which is enabled to perform the error correction operation of the first area; and
wherein the area control signal generation circuit generates the second area control signal which is enabled to perform the error correction operation of the second area.

21. The electronic device of claim 16, wherein the operation control circuit is configured to increase the refresh cycle time of the cell area performing the error correction operation.

22. The electronic device of claim 16, wherein the operation control circuit is configured to lower a voltage level of the internal voltage signal of the cell area performing the error correction operation.

23. The electronic device of claim 16, wherein the operation control circuit is configured so that the refresh cycle time of the cell area not performing the error correction operation has a predetermined cycle time and a voltage level of the internal voltage signal of the cell area not performing the error correction operation has a predetermined level.

24. An electronic device comprising:
an area control signal generation circuit configured to generate an area control signal in response to an operation control signal and an internal information signal, wherein the area control signal includes information on whether each of a plurality of cell areas performs an error correction operation;

an area column control signal generation circuit configured to delay a column pulse signal for a delay period, which is determined according to the area control signal, to generate an area column control signal that controls a column operation of the plurality of cell areas;

an area command/address generation circuit configured to generate a first delayed command, a second delayed command, a first delayed address, and a second delayed address by delaying an internal command and an address for a predetermined delay period which is determined according to the area control signal;

a core circuit configured to control the column operation of the plurality of cell areas in response to the first and second delayed commands, the first and second delayed addresses, and the area column control signal; and an operation control circuit configured to control a refresh cycle time of each of the plurality of cell areas or to control a voltage level of an internal voltage signal of each of the plurality of cell areas, according to the area control signal.

\* \* \* \* \*